United States Patent
Zhong

(10) Patent No.: US 10,615,716 B2
(45) Date of Patent: Apr. 7, 2020

(54) RECONFIGURATION OF INERTIA, DAMPING AND FAULT RIDE-THROUGH FOR A VIRTUAL SYNCHRONOUS MACHINE

(71) Applicant: Qingchang Zhong, Willowbrook, IL (US)

(72) Inventor: Qingchang Zhong, Willowbrook, IL (US)

(*) Notice: Subject to any disclaimer, the term of this patent is extended or adjusted under 35 U.S.C. 154(b) by 0 days.

(21) Appl. No.: 16/236,515

(22) Filed: Dec. 30, 2018

(65) Prior Publication Data

US 2019/0222026 A1 Jul. 18, 2019

(30) Foreign Application Priority Data

Jan. 14, 2018 (GB) .................................. 1800572.8

(51) Int. Cl.
| | |
|---|---|
| *H02M 7/538* | (2007.01) |
| *H02M 7/5387* | (2007.01) |
| *H02J 3/24* | (2006.01) |
| *H03H 7/01* | (2006.01) |
| *H02J 3/01* | (2006.01) |
| *G05B 19/042* | (2006.01) |
| *H02J 3/16* | (2006.01) |
| *H02J 3/38* | (2006.01) |
| *H02M 1/00* | (2006.01) |

(52) U.S. Cl.
CPC ...... *H02M 7/53871* (2013.01); *G05B 19/042* (2013.01); *H02J 3/01* (2013.01); *H02J 3/16* (2013.01); *H02J 3/24* (2013.01); *H03H 7/0115* (2013.01); *G05B 2219/2639* (2013.01); *H02J 3/382* (2013.01); *H02J 2203/20* (2020.01); *H02M 2001/0003* (2013.01)

(58) Field of Classification Search
CPC .... H02M 1/32; H02M 2001/0003; H02J 3/01; H02J 3/16; H02J 3/24
See application file for complete search history.

(56) References Cited

U.S. PATENT DOCUMENTS

| | | | | |
|---|---|---|---|---|
| 4,077,138 | A * | 3/1978 | Foerst | G09B 9/04 |
| | | | | 348/121 |
| 9,294,019 | B2* | 3/2016 | Liu | H02M 1/126 |
| 10,333,390 | B2* | 6/2019 | Li | H02M 7/44 |

(Continued)

FOREIGN PATENT DOCUMENTS

| | | |
|---|---|---|
| CN | 106208159 A | 12/2016 |
| CN | 107154636 A | 9/2017 |

*Primary Examiner* — Yusef A Ahmed

(57) ABSTRACT

This invention discloses a controller and method to reconfigure the inertia, damping and fault ride-through capability of a virtual synchronous machine (VSM). The virtual inertia is reconfigured via adding a low-pass filter to the torque (equivalently, active power) signal of the VSM and the virtual damping is reconfigured via adding a virtual damper between the VSM voltage and the output voltage sent to the PWM conversion, instead of adjusting the inertia and the damping in the swing equation. The function of the virtual damper is to scale the existing converter-side inductance or to insert the desired inductance into the VSM, which increases the damping. Moreover, the fault ride-through capability of the VSM can be reconfigured to achieve the given fault-current level via reconfiguring the damping and the inertia properly.

6 Claims, 9 Drawing Sheets

(56) References Cited

U.S. PATENT DOCUMENTS

| | | | |
|---|---|---|---|
| 2007/0279012 A1* | 12/2007 | Sihler | H02P 23/04 322/20 |
| 2011/0089693 A1* | 4/2011 | Nasiri | F03D 7/0272 290/44 |
| 2011/0270463 A1* | 11/2011 | Weiss | H02P 9/02 700/298 |
| 2012/0056602 A1* | 3/2012 | Li | H02P 9/48 322/89 |
| 2013/0221885 A1* | 8/2013 | Hunter | H02P 21/0003 318/400.15 |
| 2014/0049228 A1* | 2/2014 | Rodriguez Cortes | H02M 7/44 322/24 |
| 2014/0067138 A1* | 3/2014 | Rodriguez Cortes | H02P 9/10 700/286 |
| 2014/0138949 A1* | 5/2014 | El Moursi | H02P 9/10 290/44 |
| 2016/0006338 A1* | 1/2016 | Sakimoto | H02M 7/53875 363/131 |
| 2016/0173018 A1* | 6/2016 | Nondahl | H02P 27/08 318/400.02 |
| 2017/0047862 A1* | 2/2017 | Luo | H02J 3/38 |
| 2017/0141712 A1* | 5/2017 | Royak | H02P 27/06 |
| 2017/0222588 A1* | 8/2017 | Royak | H02P 23/14 |
| 2018/0138849 A1* | 5/2018 | Royak | H02P 23/26 |
| 2018/0145582 A1* | 5/2018 | Shuai | H02M 7/53873 |
| 2018/0191281 A1* | 7/2018 | Zhong | H02P 9/007 |
| 2018/0348712 A1* | 12/2018 | Zhong | G01R 15/142 |
| 2019/0109461 A1* | 4/2019 | Khajehoddin | H02J 3/42 |
| 2019/0181775 A1* | 6/2019 | Geyer | H02M 1/14 |
| 2019/0190274 A1* | 6/2019 | Fazeli | H02J 3/381 |
| 2019/0260319 A1* | 8/2019 | Gagas | B60L 15/025 |

\* cited by examiner (a)

(b)

RECONFIGURATION OF INERTIA, DAMPING AND FAULT RIDE-THROUGH FOR A VIRTUAL SYNCHRONOUS MACHINE

CROSS-REFERENCE TO RELATED APPLICATIONS

This nonprovisional patent application claims the benefit of and priority under 35 U.S. Code 119 (b) to U.K. Patent Application No. GB1800572.8 filed on Jan. 14, 2018, entitled "Reconfiguration of Inertia, Damping and Fault Ride-Through for a Virtual Synchronous Machine", the contents of which are all hereby incorporated by reference herein in its entirety.

TECHNICAL FIELD

This invention is concerned with the control and operation of power electronic converters. Possible application fields include renewable energy, such as wind, solar and wave energy, electrical vehicles, energy storage systems, aircraft power systems, different types of loads that require power electronic converters, data centers etc.

BACKGROUND

Power systems are going through a paradigm change from centralized generation to distributed generation. More and more distributed energy resources (DERs), including renewables, electric vehicles, and energy storage systems, are being integrated into the grid. The integration of DERs presents unprecedented challenges and has become an important research topic in recent years. One challenge is that a DER unit often means low inertia or even inertia-less. The large-scale utilization of DERs would cause significant decrease of inertia, which brings considerable concerns about grid stability, because inertia has been regarded as a critical factor for guaranteeing the stability of power systems.

Since synchronous machines (SM) can provide large inertia because of the large kinetic energy stored in the rotors, a lot of efforts have been made in recent years to provide additional energy when needed to mimic the inertia. For example, a fast-response battery energy storage system can be adopted to inject additional power when needed. The inertia of a PV system can be increased by adjusting the DC-link voltage and the PV array output. The kinetic energy stored in the rotor of a wind turbine can be utilized for wind plants to participate in system frequency regulation.

Another important trend is to operate power electronic converters in DER units as virtual synchronous machines (VSM), which are power electronic converters that emulate the major features of a traditional SM, such as torque, inertia, voltage, frequency, phase, and field-excitation current. VSMs have become the building blocks for future power electronics-enabled autonomous power systems, which are characterized as synchronized and democratized (SYNDEM) smart grids. Different/similar options to implement VSMs have been proposed in the literature. The VISMA approach controls the inverter current to follow the current reference generated according to the mathematical model of SM, which makes inverters behave like controlled current sources. The synchronverter (SV) approach or the static synchronous generator disclosed in US 2011/0270463 A1 directly embeds the mathematical model of SM into the controller to control the voltage generated. The conventional inertia factor J and damping factor $D_p$ of an SM are emulated through embedding the swing equation of SM in the controller. US 2014/0067138 A1 discloses a virtual controller of electromechanical characteristics for static power converters, which adopts a power loop controller with the capability of adjusting the inertia factor and the damping factor. The power loop controller is actually equivalent to the swing equation of SM. CN106208159A discloses a virtual synchronous machine-based dynamic power compensation method, which also adopts the swing equation of SM as the core of the controller but with the additional feature of adjusting the inertia factor and the damping factor according to the variation of the frequency. CN107154636A discloses a multi-target optimization control method, which also incorporates the swing equation of SM as the basis of the controller for optimization. In summary, a common feature of the state of the art about VSM is to incorporate the swing equation of SM and adjust the inertia factor and the damping factor accordingly. However, as to be shown later, the virtual inertia that can be provided by the swing equation of an SM is limited. Moreover, the frequency response of a VSM can be oscillatory when the virtual inertia increases. Furthermore, the output current of such a VSM can be excessive when a grid fault occurs, making it difficult to ride-through grid faults.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

After taking inventive steps, this invention discloses a controller and method to reconfigure the inertia, the damping and the fault ride-through capability of a VSM through a completely different way. Unlike the solutions found in the study of the state of the art, the disclosed controller and method does not adjust or optimize the inertia factor or the damping factor in the swing equation. Instead, an additional virtual inertia block and an additional virtual damping block are added to provide virtual inertia and virtual damping for a VSM.

In this disclosure, the SV or the static synchronous generator disclosed in US 2011/0270463 A1 is used as an example to facilitate the presentation. However, the disclosed invention can be applied to other schemes as long as there exists a channel that controls the active power (equivalently, the torque) and the frequency.

BRIEF DESCRIPTION OF THE DRAWINGS

The accompanying figures further illustrate the disclosed embodiments and, together with the detailed description of the disclosed embodiments, serve to explain the principles of the present invention.

DETAILED DESCRIPTION

Figure 1:
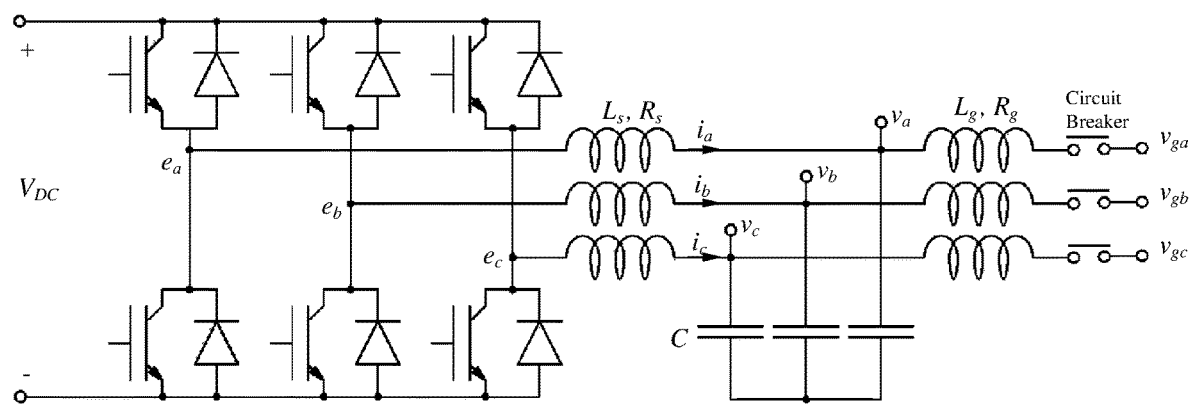
FIG. 1 shows a grid connected power electronic converter, i.e., the power part of a SV.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. used herein does not necessarily refer to a different embodiment. It is intended, for example, that claimed subject matter include combinations of example embodiments in whole or in part.

In general, terminology may be understood at least in part from usage in context. include a variety of meanings that may depend at least in part upon the context in which such terms are used. to mean A, B, and C, here used in the inclusive sense, as well as A, B, or C, here used in the exclusive sense. in part upon context, may be used to describe any feature, structure, or characteristic in a singular sense or may be used to describe combinations of features, structures or characteristics in a plural sense. to convey a singular usage or to convey a plural usage, depending at least in part upon context. to convey an exclusive set of factors and may, instead, allow for existence of additional factors not necessarily expressly described, again, depending at least in part on context.

Overview of the Synchronverter

In order to facilitate the presentation of the disclosure, the synchronverter (SV) is briefly introduced at first.

Figure 2:
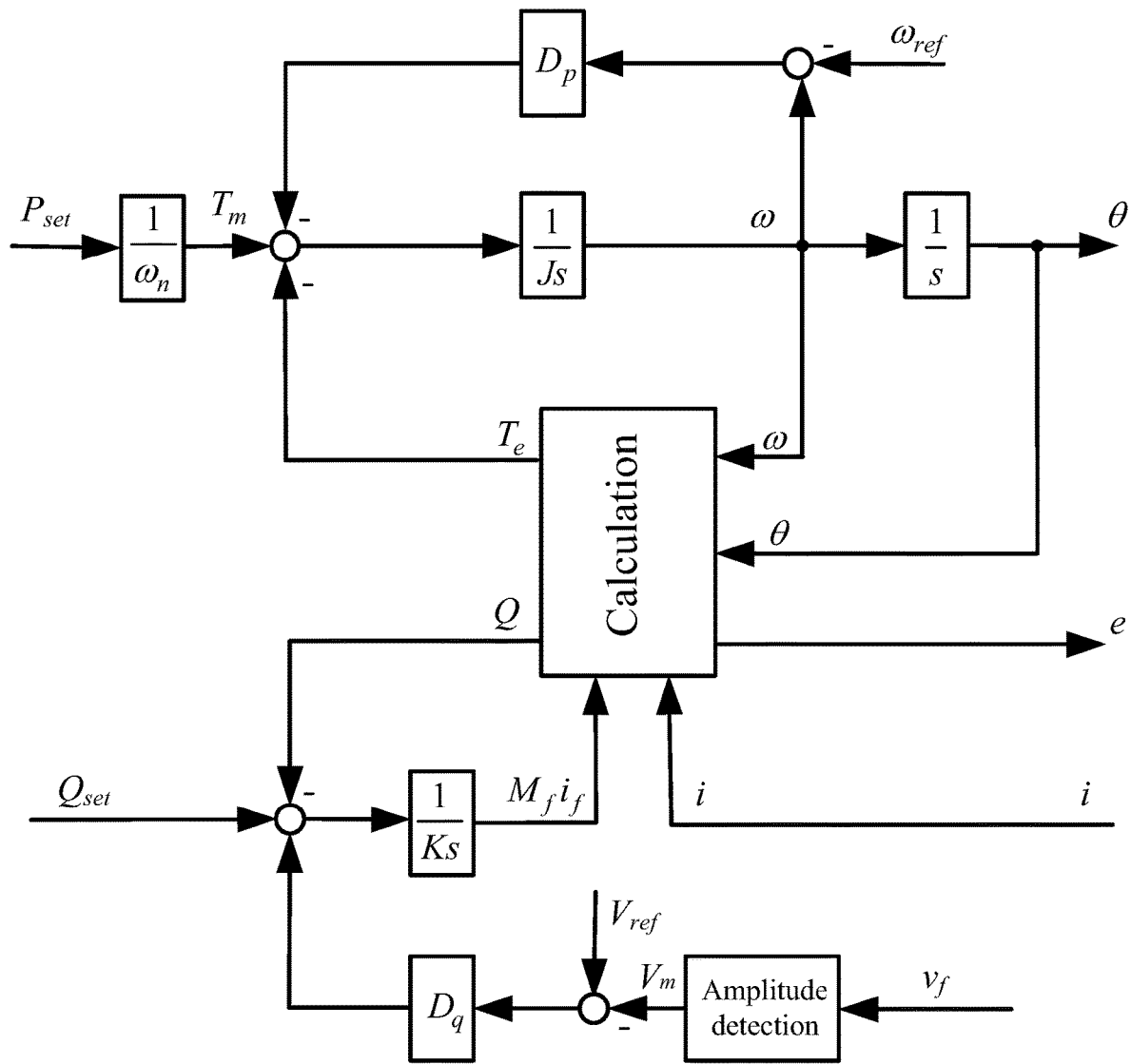
FIG. 2 shows the control part of a SV.

A synchronverter consists of two parts: the power part shown in FIG. 1 and the control part shown in FIG. 2. The power part is a conventional bridge converter cascaded with an LC or LCL filter. It can be of a single phase or of multiple phases. The converter-side inductor $L_s$ and its parasitic resistance $R_s$, then called converter-side impedance, mimic the stator inductor and its parasitic resistance of an SM. The control part includes the mathematical model of a synchronous generator described by $$J\frac{d\omega}{dt} = T_m - T_e - D_p\omega, \tag{1}$$

$$T_e = M_f i_f \langle i, \tilde{\sin}\theta \rangle, \tag{2}$$

$$e = \omega M_f i_f \tilde{\sin}\theta, \tag{3}$$

$$Q = -\omega M_f i_f \langle i, \tilde{\cos}\theta \rangle, \tag{4}$$

where $D_p$ represents the friction; $T_m$, and $T_e$ are the mechanical torque and the electromagnetic torque, respectively, θ is the rotor angle, $\omega=\dot{\theta}$ is the angular frequency, $M_f i_f$ reflects the field excitation, Q is the reactive power, and e is the generated VSM voltage or the virtual back electromotive force (EMF). Without loss of generality, it can be assumed that ω is also the frequency of the electricity generated under the assumption that the pair of poles per phase for the magnetic field is one. The vectors $\tilde{\sin}\theta$ and $\tilde{\cos}\theta$ are defined as $$\tilde{\sin}\theta = \begin{bmatrix} \sin\theta \\ \sin\left(\theta - \frac{2\pi}{3}\right) \\ \sin\left(\theta + \frac{2\pi}{3}\right) \end{bmatrix}, \tilde{\cos}\theta = \begin{bmatrix} \cos\theta \\ \cos\left(\theta - \frac{2\pi}{3}\right) \\ \cos\left(\theta + \frac{2\pi}{3}\right) \end{bmatrix}$$

for three-phase applications or sin θ and cos θ for single-phase applications. The capacitor voltage $v=[v_a\ v_b\ v_c]^T$ is the voltage of the SV, which is connected to the grid through a circuit breaker and a grid-side inductor. The equation (1) is called the swing equation, where J is called the inertia and $D_p$ plays the role of the damping. The three equations (2)-(4) are included in the Calculation block of FIG. 2. Note that the torque $T_e$ and the active power P of a synchronous machine satisfy $P=\omega T_e$. When the frequency $\omega$ only varies within a small range, what holds true for the torque $T_e$ equivalently holds true for the active power P.

The controller shown in FIG. 2 has two channels: the frequency channel to generate the frequency and the voltage channel to generate the field-excitation $M_f i_f$, which together form the voltage amplitude E of e. The term $D_p$ actually serves the purpose of the frequency droop control and the term $D_q$ is introduced to implement the voltage droop control. The integrator $$\frac{1}{K_s}$$

generates the field excitation $M_f i_f$. In the steady state, there are $$\omega = \omega_{ref} + \frac{1}{D_p}(T_m - T_e),$$

$$V_m = V_{ref} + \frac{1}{D_q}(Q_{set} - Q).$$

As a result, an SV is able to take part in the regulation of system frequency and voltage. Since the commonly-needed phase-locked loop can be removed, it is not shown in the controller.

The frequency droop coefficient $D_p$ is defined for the frequency drop of $\alpha$ (%) to cause the torque (equivalently, active power) increase of 100%. Then, $$D_p = \frac{S_n/\omega_n}{\alpha \omega_n} = \frac{S_n}{\alpha \omega_n^2}, \tag{5}$$

where $\omega_n$ is the rated angular frequency and $S_n$ is the rated power. The voltage droop coefficient $D_q$ is defined for the voltage drop of $\beta$ (%) to cause the reactive power increase of 100%. Then, $$D_q = \frac{S_n}{\beta \sqrt{2} V_n}, \tag{6}$$

where $V_n$, is the rated RMS phase voltage. The $\sqrt{2}$ is due to the fact that the voltage amplitude $V_m$ instead of the RMS voltage is fed back. $v_f$ is the feedback voltage, which is often v.

Limitation of the Inertia of a Synchronverter

Figure 3:
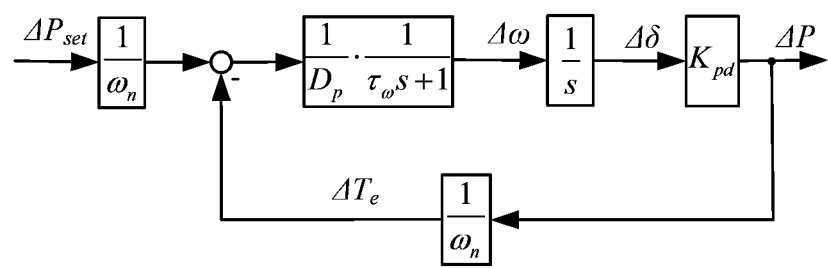
FIG. 3 shows the small-signal model of the active power loop of a conventional SV.

Under some mild conditions, the two channels can be decoupled by design. The small-signal model of the frequency channel can be illustrated as shown in FIG. 3. The gain $K_{pd}$ reflects the amplification from the change of the power angle, $\Delta\delta$, to the change of the active power and can be represented as $$K_{pd} = N \frac{V_n^2}{X},$$

where $X=\omega_n L_s$ is the impedance of the inductor $L_s$, and N represents the number of phases, i.e., N=3 for a three-phase VSM or N=1 for a single-phase VSM. The transfer function from $\Delta P$ to $\Delta \omega$ is then $$\frac{\Delta \omega}{\Delta P} = -\frac{1}{\omega_n D_p} \cdot \frac{1}{\tau_\omega s + 1}, \tag{7}$$

where $\tau_\omega = J/D_p$ is called the inertia time constant as mentioned before. Naturally, $J=\tau_\omega D_p$ is often regarded as the virtual inertia. However, it also determines the time constant of the frequency loop. Hence, the inertia provided by J may be limited, as explained below.

The transfer function from $\Delta P_{set}$ to $\Delta P$ can be found as $$\frac{\Delta P}{\Delta P_{set}} = \frac{1}{\tau_p(\tau_\omega s + 1)s + 1}, \tag{8}$$

where $$\tau_p = \frac{D_p \omega_n}{K_{pd}} = \frac{D_p \omega_n X}{N V_n^2}. \tag{9}$$

Substituting (5) into it, then $$\tau_p = \frac{S_n X}{\alpha N V_n^2 \omega_n}. \tag{10}$$

Assume the base voltage is chosen as the RMS phase voltage $V_n$ and the base power is chosen as the rated power $S_n$. Then the base impedance is $$Z_{base} = N V_n^2 / S_n$$

and the per-unit output impedance of the SV is $$X^{pu} = \frac{X}{Z_{base}} = \frac{S_n X}{N V_n^2}.$$

Hence, there is $$\tau_p = \frac{X^{pu}}{\alpha \omega_n}. \tag{11}$$

Since $\omega_n$ and $\alpha$ are both specified by the grid code, it is obvious that, for a given power system, $\tau_p$ is only determined by and proportional to $X^{pu}$. Once the SV hardware is designed, the corresponding $\tau_p$ is fixed.

The system in FIG. 3 or the transfer function (8) has two eigenvalues $$\lambda_{1,2} = \frac{-\tau_p \pm \sqrt{\tau_p^2 - 4\tau_p \tau_\omega}}{2\tau_p \tau_\omega} = \frac{-1 \pm \sqrt{1 - 4\tau_\omega/\tau_p}}{2\tau_\omega}.$$

When $0<\tau_\omega \ll \tau_p$, the two eigenvalues are on the real axis, at $$\lambda_1 \approx -\frac{1}{\tau_\omega} \text{ and } \lambda_2 \approx -\frac{1}{\tau_p}.$$

The system is dominated by $\lambda_2$ because $\lambda_1$ is too far away from the imaginary axis. When $\tau_\omega$ increases, the eigenvalues move towards each other on the real axis. Then the two eigenvalues become conjugate when $\tau_\omega > 0.25\tau_p$, with the imaginary part initially increasing and then decreasing. The imaginary part reaches the maximum when $\tau_\omega = 0.5\tau_p$. The two eigenvalues move toward the imaginary axis when $\tau_\omega$ increases further. The damping ratio of the active-power loop when $\tau_\omega > 0.25\tau_p$ is $$\zeta = \frac{1}{2\sqrt{\tau_\omega/\tau_p}}. \quad (12)$$

Note that $$\zeta = \frac{1}{\sqrt{2}}$$

when $\tau_\omega = 0.5\tau_p$. In other words, increasing $\tau_\omega$ makes the system response oscillatory and reduces the stability margin. This means there is an upper limit on the inertia time constant $\tau_\omega$ for a given system, which has a fixed $\tau_p$ as given in (11). In other words, the virtual inertia provided by J or $\tau_\omega$ is limited.

Indeed, since $\tau_\omega$ is the time constant of the frequency loop, it is recommended to chose it much smaller than the fundamental period, e.g., as $0.1/f_n$ s. As a result, the condition $0 < \tau_\omega \ll \tau_p$ often holds. The transfer function from $\Delta P_{set}$ to $\Delta P$ given in (8) can be simplified as $$\frac{\Delta P}{\Delta P_{set}} = \frac{1}{\tau_p s + 1}. \quad (13)$$

The Disclosed Invention

Figure 4:
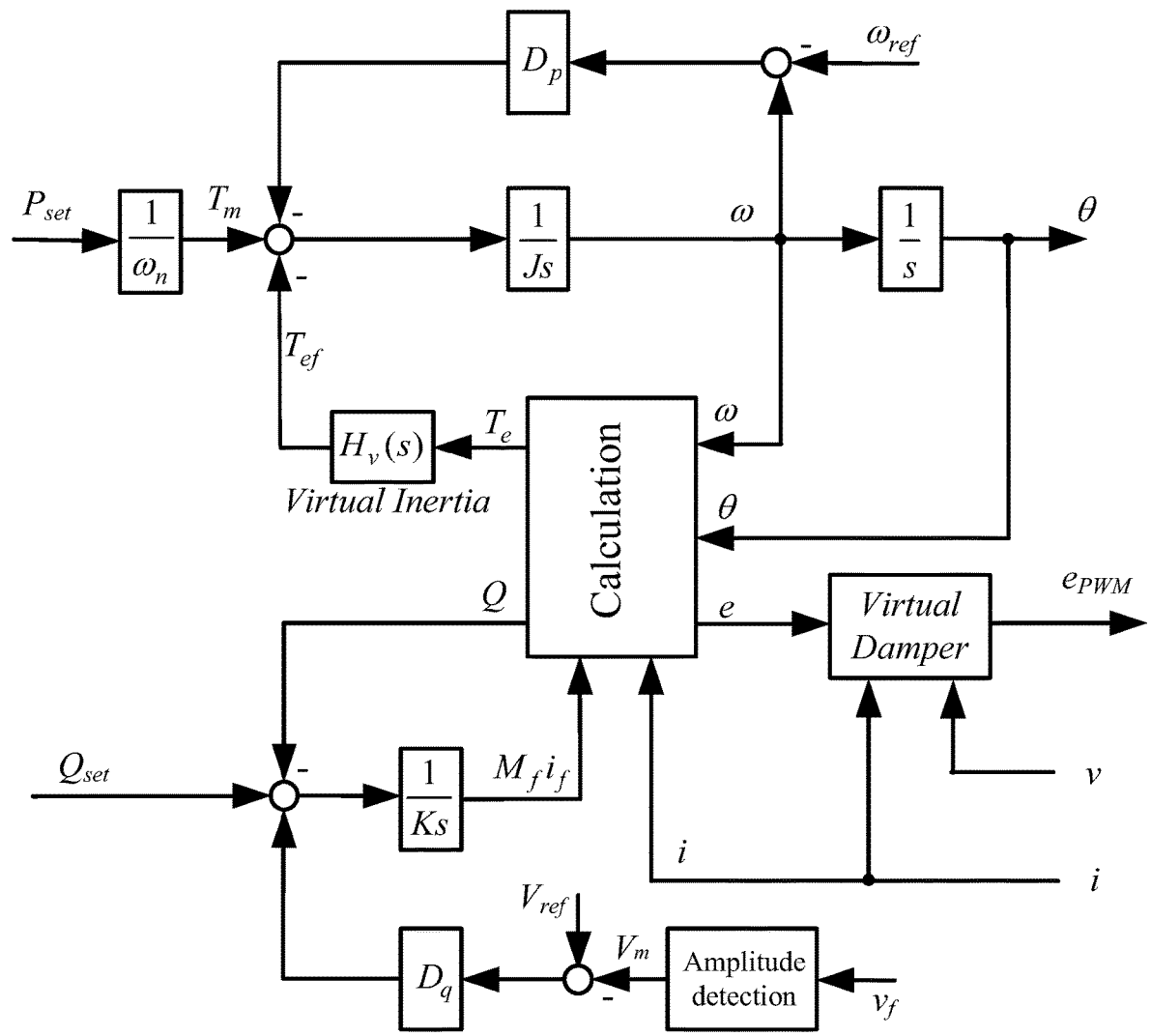
FIG. 4 shows the disclosed controller for a VSM to achieve reconfigurable inertia and damping through an additional virtual inertia block $H_v$ and an additional virtual damper block.

FIG. 4 shows the disclosed controller and method for a VSM to achieve reconfigurable inertia and damping. A virtual inertia block $H_v(s)$ is added to the torque (equivalently, active power) signal of the VSM and a virtual damper is added to the VSM voltage e before sending it out as output voltage $e_{PWM}$. As will be shown later, these two are linked together. The voltage feedback can be chosen as v, e, or $e_{PWM}$, depending on the implementation. The integrators can be implemented with the normal integrator, or the normal integrator with saturation, or a nonlinear integrator that is able to limit the output of the integrator.

The Virtual Inertia

In order to be able to reconfigure the inertia of a VSM, a virtual inertia block $H_v(s)$ is added to the torque signal of the VSM, as shown in FIG. 4, instead of adjusting the inertia J in the swing equation. It can be implemented via a low-pass filter to slow the response down. There are many options to implement this and the simplest one is to adopt $$H_v(s) = \frac{1}{J_v s + 1}, \quad (14)$$

where $J_v$ is the virtual inertia required. There is normally a low-pass filter to remove the ripples in the torque but its time constant is often much smaller than $J_v$ and it has a different function. The virtual block $H_v$ can be put in series with it or replace it.

Figure 5:
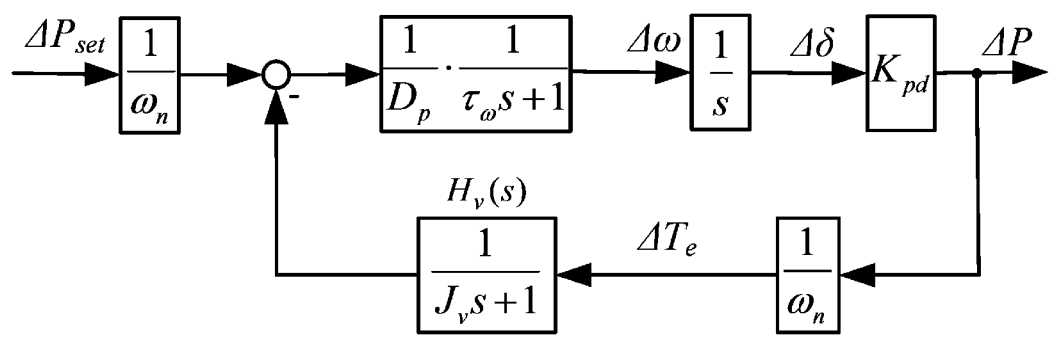
FIG. 5 shows the small-signal model of the active-power loop with the reconfigurable virtual inertia block $H_v(s)$ of the disclosed VSM.

The corresponding small-signal model of the active-power loop is shown in FIG. 5. The transfer function from $\Delta P$ to $\Delta \omega$ is $$\frac{\Delta \omega}{\Delta P} = -\frac{1}{\omega_n D_p} \cdot \frac{1}{\tau_\omega s + 1} \cdot \frac{1}{J_v s + 1}.$$

This is a second-order system with a small $\tau_\omega$ as explained before. It can be simplified as $$\frac{\Delta \omega}{\Delta P} \approx -\frac{1}{\omega_n D_p} \cdot \frac{1}{(J_v + \tau_\omega)s + 1}. \quad (15)$$

If $J_v \gg T_\omega$, then the equivalent inertia is $J_v$.

The characteristic equation of the active-power loop shown in FIG. 5 can be found as $$1 + \tau_p(J_v s + 1)(\tau_\omega s + 1)s = 0 \quad (16)$$

If a relatively large inertia $J_v \gg \tau_\omega$ is desired, then the term $$\frac{1}{\tau_\omega s + 1}$$

can be ignore and the characteristic equation (16) can be simplified as $$\tau_p(J_v s + 1)s + 1 = 0.$$

This is the same as the characteristic equation of the system in (8) but with $\tau_\omega$ replaced by $J_v$. According to (12), the damping ratio of the system when $J_v > 0.25\tau_p$ is $$\zeta = \frac{1}{2\sqrt{J_v/\tau_p}}. \quad (17)$$

If the virtual inertia $J_v$ is configured to be large with comparison to $\tau_p$, then the damping of the system is small, resulting in oscillatory responses. This may lead to large transient currents, which might overload or even damage the converter. It is critical for the damping of the VSM to be large enough.

Assume the desired damping ratio is $\zeta_0$. Then, according to (17), the corresponding $\tau_p$ is $$\tau_p = 4\zeta_0^2 J_v,$$

and, according to (11), the equivalent p.u. impedance $X_v^{pu}$ is $$X_v^{pu} = \alpha \omega_n \tau_p = 4\zeta_0^2 J_v \alpha \omega_n. \quad (18)$$

This requires the corresponding inductance $L_v$ to be $$L_v = \frac{X_v^{pu}}{\omega_n} Z_{base} = 4\zeta_0^2 J_v \alpha Z_{base} = \frac{4\zeta_0^2 J_v \alpha N V_n^2}{S_n}. \quad (19)$$

Apparently, this is different from the inductance $L_s$ existing in the hardware.

The Virtual Damper

Figure 6:
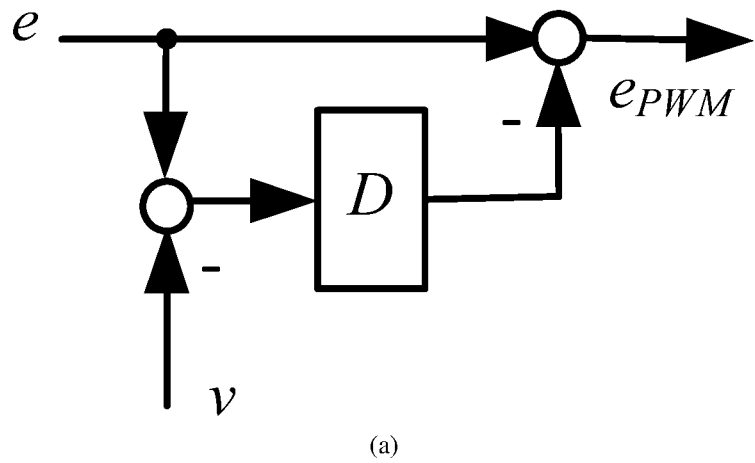
FIG. 6 illustrates the implementations of a virtual damper: (a) through impedance scaling with a voltage controller; (b) through impedance insertion with a current controller.
Figure 6:
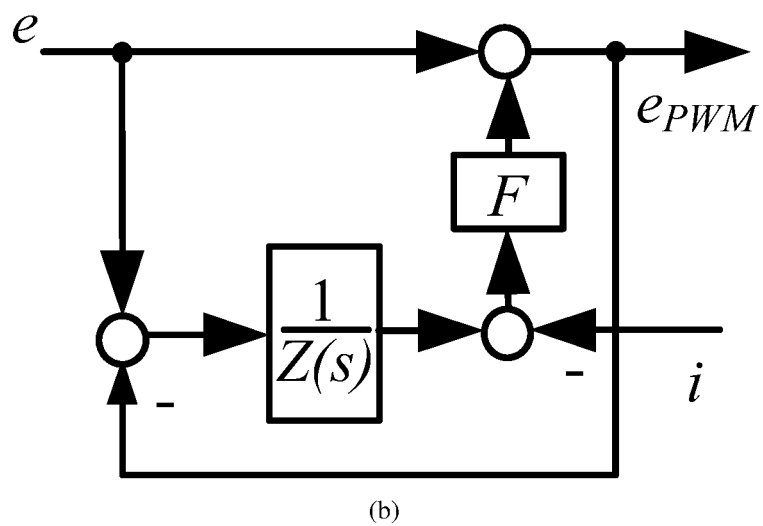

As discussed, there is a need to reconfigure the damping of the VSM to avoid oscillatory frequency responses, which boils down to reconfigure the converter-side inductance $L_s$ as $L_v$. This can be achieved via putting the generated VSM voltage e through a virtual damper before sending it for PWM conversion, as shown in FIG. 4, instead of adjusting the damping $D_p$ in the swing equation. The virtual damper also takes the voltage v and/or the current i as inputs. Here, two possible implementations are shown in FIG. 6, one through impedance scaling with a voltage feedback controller and the other through impedance insertion with a current feedback controller.

Through Impedance Scaling with an Inner-loop Voltage Controller

As shown in FIG. 6(a), it consists of a voltage feedback controller to scale the voltage difference e–v with the factor D and subtracts it from the original signal e to form the new control signal $e_{PWM}$. Hence, $$e_{PWM} = e - D(e-v), \quad (20)$$

which, in lieu of e, is converted to PWM signals to drive the switches in the power part. Since the switching frequency of the converter is normally much higher than the system frequency, there is $$e_{PWM} \approx v + v_s, \quad (21)$$

where $v_s$ is the voltage across the inductor $L_s$, when considering the average values over a switching period for the PWM signals. Combining (20) and (21), then there is $$e \approx v + \frac{1}{1-D} v_s. \quad (22)$$

In other words, the function of the virtual damper is to replace the inductor $L_s$ with $$\frac{1}{1-D} L_s$$

or to scale the original impedance by $$\frac{1}{1-D}.$$

Hence, this technique is called impedance scaling. In order to scale $L_s$ to $L_v$, D should be chosen as $$D = 1 - \frac{L_s}{L_v}$$

or, substituting (19) into it, as $$D = 1 - \frac{S_n L_s}{4\zeta_0^2 J_v \alpha N V_n^2}.$$

The gain $$D = 1 - \frac{L_s}{L_v}$$

is static but D can also be chosen dynamic as well because the function of the virtual damper is to scale the original impedance by $$\frac{1}{1-D},$$

which can be designed to include desired frequency characteristics. For example, it can be chosen as $$D(s) = 2 - \frac{L_s}{L_v} - \Pi_h \frac{s^2 + 2\zeta_h h\omega_n K_h s + (h\omega_n)^2}{s^2 + 2\zeta_h h\omega_n s + (h\omega_n)^2}$$

where $\zeta_h$ can be chosen as $\zeta_h = 0.01$ to accommodate frequency variations and h can be chosen to cover the major harmonic components in the current, e.g. the 3rd, 5th and 7th harmonics. The scaling factor is $$\frac{1}{1-D} = \frac{1}{1 - \left(2 - \frac{L_s}{L_v} - 1\right)} = \frac{L_v}{L_s}$$

at low and high frequencies and $$\frac{1}{1-D} = \frac{1}{1 - \left(2 - \frac{L_s}{L_v} - K_h\right)} = \frac{1}{K_h - 1 + \frac{L_s}{L_v}}$$

at the h-th harmonic frequency. While it meets the requirement of the virtual damping, it also scales the impedance at the harmonic frequencies by a factor of $$\frac{1}{K_h - 1 + \frac{L_s}{L_v}}.$$

If $$K_h > 2 - \frac{L_s}{L_v},$$

then the impedance at the h-th harmonic frequency is reduced, which enhances the quality of the VSM voltage v.

Through Impedance Insertion with an Inner-loop Current Controller

Instead of using the voltage feedback controller shown in FIG. 6(a), it is also possible to adopt a current feedback controller to implement the virtual damper and generates the new control signal $e_{PWM}$, as shown in FIG. 6(b). The voltage difference $e - e_{PWM}$ is passed through an impedance Z(s) to generate a current reference, of which the difference with the feedback current i is scaled by a factor F and added to the original signal e to form the new control signal $e_{PWM}$. Hence, $$e_{PWM} = e + F\left(\frac{1}{Z(s)}(e - e_{PWM}) - i\right), \quad (23)$$

which, in lieu of e, is converted to PWM signals to drive the switches in the power part. This is equivalent to having $$e = e_{PWM} + \frac{F}{Z(s) + F}Z(s)i.$$

Choose F as a positive large number and $$Z(s) = sL_v. \quad (24)$$

Then $$\frac{F}{sL_v + F}$$

is a low-pass filter with a small time constant and $$\frac{F}{sL_v + F} \approx 1$$

over a wide range of frequencies. As a result, $$e = e_{PWM} + \frac{F}{sL_v + F}sL_v i \approx e_{PWM} + sL_v i.$$

In other words, the function of the virtual damper shown in FIG. 6(b) is to insert an inductor $L_v$ between e and $e_{PWM}$ with the current i flowing through it, meeting the requirement on the equivalent inductance. Hence, this technique is called impedance insertion. Here, it is assumed that $e_{PWM}$ is adopted as the feedback voltage $v_f$. If $v_f = v$, then the inductance $L_s$ between $e_{PWM}$ and v should be considered, via choosing $Z(s) = s(L_v - L_s)$.

The impedance Z(s) in (24) is inductive but it can include a resistive term as well.

Fault Ride-through Capability

The fault ride-through capability of a VSM is very important. The worst case is that there is a ground fault across the capacitor, i.e., v=0. In this case, the whole voltage e is dropped on the corresponding equivalent inductance $L_v$. Since the voltage v is dropped to nearly zero, the corresponding reactive power in the steady state (assuming $Q_{set}=0$) is $$Q = D_q V_{ref} = \frac{S_n}{\beta\sqrt{2}\,V_n}\sqrt{2}\,V_n = \frac{S_n}{\beta}$$

when the parasitic resistance $R_s$ is negligible. This is the reactive power of the equivalent inductance $L_v$. Hence, the corresponding p.u. RMS voltage $E_{fault}^{pu}$ is $$E_{fault}^{pu} = \sqrt{\frac{Q\omega L_v}{N}} \bigg/ V_n = \sqrt{\frac{S_n \omega L_v}{\beta N V_n^2}}.$$

Note that this voltage is a number and it is not a physical voltage so even if it is large it is not a problem. Substituting (19) into it and considering that $\omega \approx \omega_n$ and (18), then $$E_{fault}^{pu} \approx \sqrt{\frac{S_n \omega}{\beta N V_n^2} \frac{4\zeta_0^2 J_v \alpha N V_n^2}{S_n}} = \sqrt{\frac{4\zeta_0^2 J_v \alpha \omega_n}{\beta}} = \sqrt{\frac{X_v^{pu}}{\beta}}.$$

As a result, the corresponding p.u. RMS fault current is $$I_{fault}^{pu} = \frac{E_{fault}^{pu}}{X_v^{pu}} = \frac{1}{\sqrt{\beta X_v^{pu}}}. \quad (25)$$

In practice, the actual $E_{fault}^{pu}$ would be larger and the actual $I_{fault}^{pu}$ would be smaller because of the parasitic resistance $R_s$. The larger the voltage droop coefficient β, the smaller the fault current; the larger the equivalent p.u. impedance $X_v^{pu}$ (or the inertia) the smaller the fault current.

TABLE I

Simulation parameters

| Parameters | Values | Parameters | Values |
|---|---|---|---|
| $\tau_\omega$ | 0.002 s | $L_s$ | 0.23 mH |
| $J_v$ | 0.02 s | $P_{set}$ | 50 W |
| $D_p$ | 0.2026 | $Q_{set}$ | 0 Var |
| $D_q$ | 117.88 | Nominal power | 100 VA |
| $V_n$ | 12 V | $f_n$ | 50 Hz |

For a desired fault current $I_{fault}^{pu}$, according to (25), the required $X_v^{pu}$ is $$X_v^{pu} = \frac{1}{\beta(I_{fault}^{pu})^2}$$

and the corresponding $L_v$ is $$L_v = \frac{X_v^{pu} Z_{base}}{\omega_n} = \frac{1}{\beta(I_{fault}^{pu})^2} \frac{NV_n^2}{\omega_n S_n}.$$

According to (18), the corresponding inertia $J_v$ is $$J_v = \frac{X_v^{pu}}{4\zeta_0^2 \alpha \omega_n} = \frac{1}{4\zeta_0^2 \alpha \omega_n \beta(I_{fault}^{pu})^2}.$$

This is a very fundamental formula. It links together most of the key parameters of the disclosed VSM, including the damping ratio $\zeta_0$, the virtual inertia $J_v$, the frequency droop coefficient α, the voltage droop coefficient β, the fault current level $I_{fault}^{pu}$, and the rated system frequency $\omega_n$. These are all linked with each other.

In implementation, it is possible to limit the integrator output $M_f i_f$ to limit $E_{fault}^{pu}$ and, hence, the fault-current level $I_{fault}^{pu}$. If e is adopted as the voltage feedback $v_f$, it is also possible to reduce the fault-current level $I_{fault}^{pu}$.

Validation with Computational Simulations

The parameters of the single-phase converter used in the simulations are given in Table I. The frequency droop coefficient is chosen as α=0.5%, which leads to $D_p$=0.2026, and the voltage droop coefficient is chosen as β=5%, which leads to $D_q$=117.88. The desired damping ratio is chosen as $\zeta_0$=0.707. As a result, $$L_v = \frac{2J_v \alpha N V_n^2}{S_n} = \frac{2J_v \times 0.5\% \times 12^2}{100} \times 1000 = 14.4 J_v \text{ mH}.$$

Reconfigurability of the Inertia and the Damping

In this case, the VSM operates in the stand-alone mode to supply both $LD_1$ and $LD_2$ equal to 0.4 pu via the AC bus. Before t=0, both $LD_1$ and $LD_2$ are connected to the AC bus so the load power is 0.8 pu. At t=0, $LD_2$ is disconnected from the AC bus. The damping is configured as $\zeta_0$=0.707.

Figure 7:
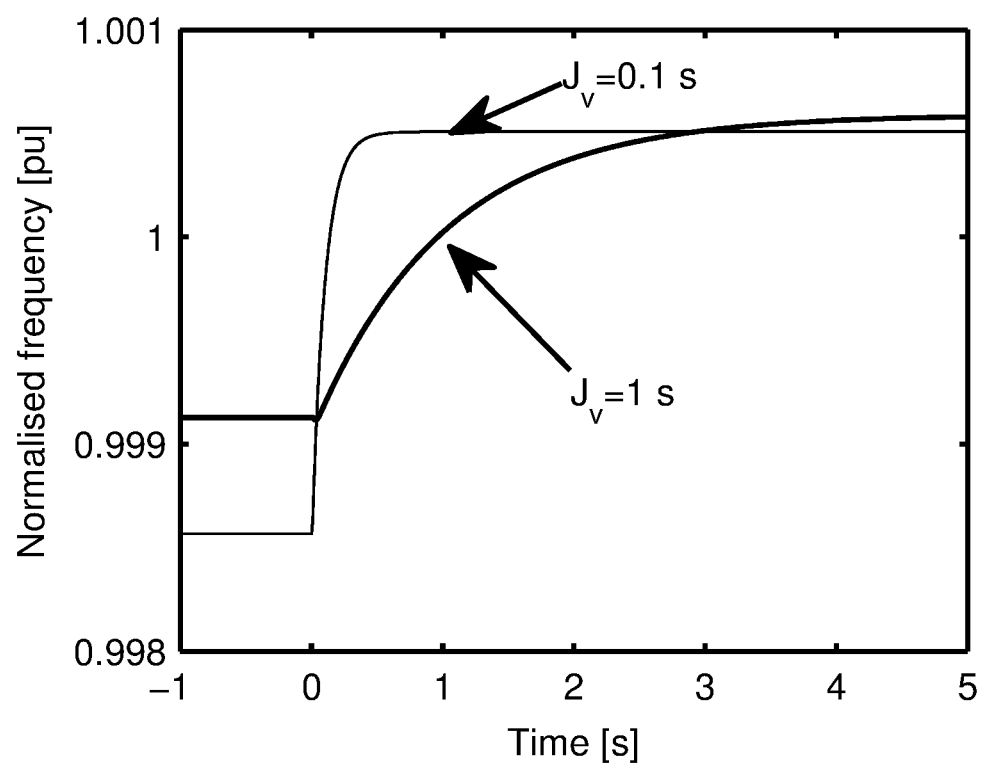
FIG. 7 illustrates the normalized frequency response of a VSM with reconfigurable inertia and damping.

The frequency responses of the VSM with different virtual inertia are shown in FIG. 7. When the load LD2 is disconnected, the frequency increases. Apparently, the frequency response behaves as expected: increasing the virtual inertia $J_v$ indeed slows the frequency response down. Moreover, because of the damping ratio is designed to be $\zeta_0$=0.707, the frequency response is very smooth, without visible overshoot. Note that the steady-state frequencies before and after the load change in the two cases are slightly different because the actual real power are slightly different.

Effect of the Virtual Damping

Figure 8:
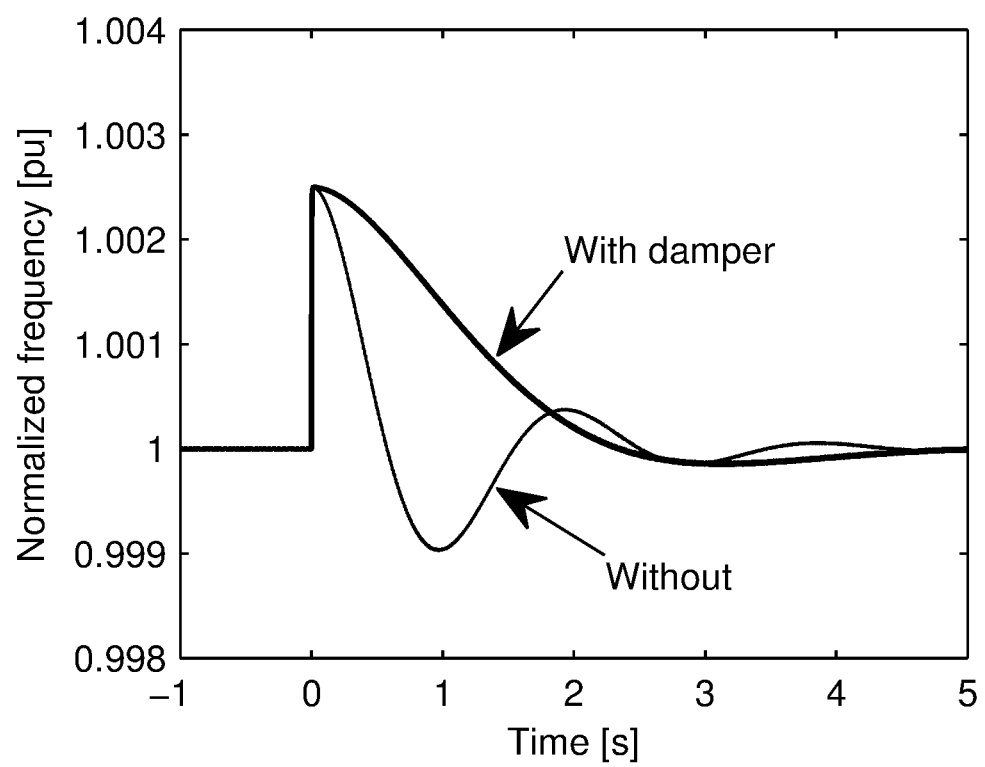
FIG. 8 shows the effect of the virtual damper on the frequency response.

In this case, the VSM is connected to a stiff grid to supply both $LD_1$ and $LD_2$ equal to 0.4 pu. Before t=0, the active power set point of the VSM is 0. At t=0, it is changed to $\Delta P_{set}$=50 W. The simulation results with virtual inertia $J_v$=0.5 s are shown in FIG. 8 for the cases with and without the virtual damper. When the virtual damper is not enabled, the response is oscillatory (denoted "Without" in the figure). When the virtual damper is enabled, the response is very smooth (denoted "With damper" in the figure).

Fault Ride-through Capability

Figure 9:
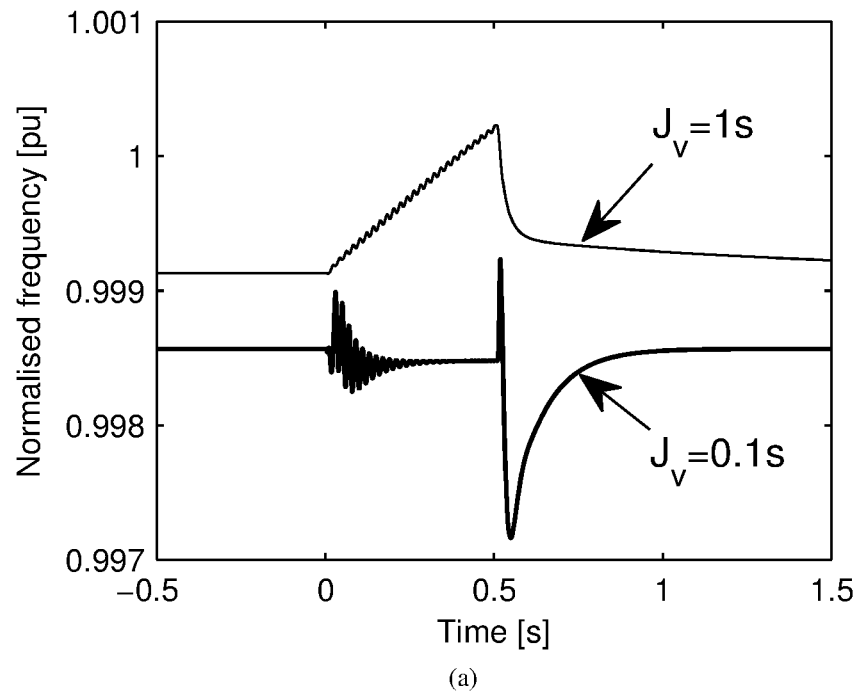
FIG. 9 shows the fault ride-through capability of the VSM with different inertia: (a) the frequency response, and (b) the fault current.
Figure 9:
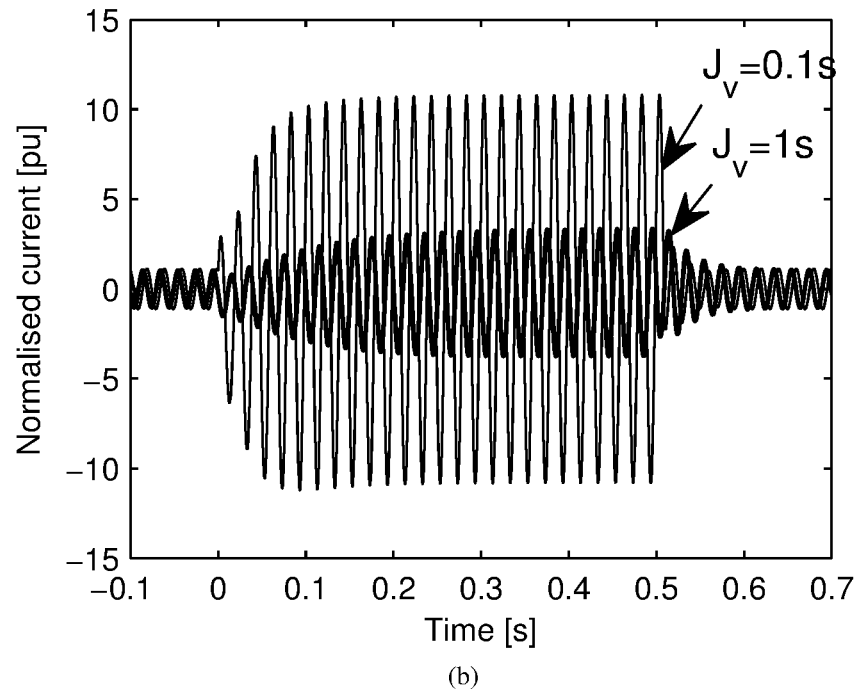

In this case, the VSM is connected to supply both $LD_1$ and $LD_2$ equal to 0.4 pu. At t=0, a ground fault occurs at the AC bus and lasts for 0.5s. The frequency responses with different inertia $J_v$ under the ground fault are shown in FIG. 9. Before the ground fault occurs, the frequencies at the two cases are slightly different because of the slight difference of the active power output. In both cases, the frequency changes slightly but the current changes dramatically and over-current appears. The larger the inertia, the smaller the over-current. With $J_v$=1 s, the current is about 236%, which is slightly less than the value of 252% calculated from (25). After the fault is cleared at t=0.5 s, the frequency and the current of the VSMs return to normal. The provision of reconfigurable inertia $J_v$ and damping can significantly reduce the over-current, and enhance the fault ride-through capability.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. A controller to operate a power electronic converter having an LC filter consisting of a converter-side inductor and a capacitor as a virtual synchronous machine (VSM), comprising:
   a frequency channel that generates a frequency signal and a phase signal based on a difference between a given torque reference and a torque feedback signal decreased by a scaled difference between a frequency reference and the frequency signal;
   a voltage channel that generates a field-excitation signal based on a difference between a given reactive power reference and a reactive power feedback signal plus a scaled difference between a voltage reference and a first voltage feedback signal;
   a calculation block that generates a VSM voltage, a torque signal and the reactive power feedback signal based on the frequency signal, the phase signal, the field-excitation signal, and a current flowing through the converter-side inductor;
   a virtual inertia block that generates the torque feedback signal based on the torque signal; and
   a virtual damper that generates an output voltage to drive the power electronic converter after pulse-width modulation (PWM) based on the VSM voltage, a second voltage feedback signal and the current flowing through the converter-side inductor;
   wherein the virtual damper configures the virtual synchronous machine to achieve a given inertia time constant and a given damping via scaling an inductance of the converter-side inductor, and
   wherein the virtual damper generates the output voltage via subtracting, from the VSM voltage, a difference between the VSM voltage and the second voltage feedback signal scaled by a transfer function.

2. The controller as claimed in claim 1, wherein the virtual inertia block is a low-pass filter.

3. The controller as claimed in claim 1, wherein the virtual inertia block is a first-order low-pass filter with its time constant configured as the given inertia time constant.

4. The controller as claimed in claim 1, wherein the second voltage feedback signal is a voltage across the capacitor.

5. A method to operate a power electronic converter having an LC filter consisting of a converter-side inductor and a capacitor as a virtual synchronous machine (VSM), the method comprises the steps of:
   generating a frequency signal and a phase signal based on a difference between a given torque reference and a torque feedback signal decreased by a scaled difference between a frequency reference and the frequency signal;
   generating a field-excitation signal based on a difference between a given reactive power reference and a reactive power feedback signal plus a scaled difference between a voltage reference and a first voltage feedback signal;
   generating a VSM voltage, a torque signal, and the reactive power feedback signal based on the frequency signal, the phase signal, the field-excitation signal, and a current flowing through the converter-side inductor;
   generating the torque feedback signal based on the torque signal; and
   generating an output voltage to drive the power electronic converter after pulse-width modulation (PWM) based on the VSM voltage, a second voltage feedback signal, and the current flowing through the converter-side inductor;

wherein the output voltage is generated via subtracting, from the VSM voltage, a difference between the VSM voltage and the second voltage feedback signal scaled by a transfer function to scale an inductance of the converter-side inductor so that the virtual synchronous machine is configured to achieve a given inertia time constant and a given damping.

6. A controller to operate a power electronic converter having an LC filter consisting of a converter-side inductor and a capacitor as a virtual synchronous machine (VSM), comprising:

a frequency channel that generates a frequency signal and a phase signal based on a difference between a given torque reference and a torque feedback signal decreased by a scaled difference between a frequency reference and the frequency signal;

a voltage channel that generates a field-excitation signal based on a difference between a given reactive power reference and a reactive power feedback signal plus a scaled difference between a voltage reference and a first voltage feedback signal;

a calculation block that generates a VSM voltage, a torque signal and the reactive power feedback signal based on the frequency signal, the phase signal, the field-excitation signal, and a current flowing through the converter-side inductor;

a virtual inertia block that generates the torque feedback signal based on the torque signal; and a virtual damper that generates an output voltage to drive the power electronic converter after pulse-width modulation (PWM) based on the VSM voltage, a second voltage feedback signal and the current flowing through the converter-side inductor;

wherein the virtual damper configures the virtual synchronous machine to achieve a given inertia time constant and a given damping via inserting a desired impedance between the VSM voltage and the output voltage to achieve the given inertia time constant and the given damping, and wherein the virtual damper generates the output voltage via adding, to the VSM voltage, a scaled difference between a reference current generated by passing a voltage difference between the VSM voltage and the output voltage through an inductive impedance and the current flowing through the converter-side inductor.

* * * * *